United States Patent
Lee et al.

(10) Patent No.: US 7,919,373 B2
(45) Date of Patent: Apr. 5, 2011

(54) METHOD FOR DOPING POLYSILICON AND METHOD FOR FABRICATING A DUAL POLY GATE USING THE SAME

(75) Inventors: Jin-Ku Lee, Ichon-shi (KR); Jae-Geun Oh, Ichon-shi (KR); Sun-Hwan Hwang, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 219 days.

(21) Appl. No.: 12/165,182

(22) Filed: Jun. 30, 2008

(65) Prior Publication Data

US 2009/0061602 A1    Mar. 5, 2009

(30) Foreign Application Priority Data

Aug. 30, 2007 (KR) .................. 10-2007-0087658
Apr. 21, 2008 (KR) .................. 10-2008-0036657

(51) Int. Cl.
*H01L 21/336* (2006.01)
*H01L 21/00* (2006.01)
*H01L 21/20* (2006.01)

(52) U.S. Cl. ............... 438/264; 438/486; 257/E21.414

(58) Field of Classification Search ............ 438/264, 438/265, 486, 150; 257/E21.09, E21.414, 257/E21.423

See application file for complete search history.

(56) References Cited

U.S. PATENT DOCUMENTS

2007/0196988 A1* 8/2007 Shroff et al. ............ 438/299
2008/0003751 A1* 1/2008 Park et al. ............... 438/283

FOREIGN PATENT DOCUMENTS

| KR | 1998-068517 | 10/1998 |
| KR | 1019990083170 A | 11/1999 |
| KR | 1020020058456 A | 7/2002 |
| KR | 1020060010465 A | 2/2006 |

OTHER PUBLICATIONS

Korean Patent No. 10-2000-0086562 Jong-Hyeok Oh, "The semiconductor device fabricating method having dual polysilicon gate structure" Dec. 30, 2000 Korean Patent.*
10-2008-0036657 Korean office action dispatched on Mar. 11, 2010.*

* cited by examiner

*Primary Examiner* — Walter L Lindsay, Jr.
(74) *Attorney, Agent, or Firm* — Kilpatrick Townsend & Stockton LLP (57) ABSTRACT

A method for doping polysilicon improves a doping profile during plasma doping and includes forming a silicon layer using two separate operations. After forming a first silicon layer, thermal annealing is performed to crystallize the first silicon layer, such that the uniformity of a doping concentration according to the depth of a layer inside is improved during plasma doping. Additionally, a doping concentration at the interface between a polysilicon layer and a gate oxide layer is increased. A by-product deposition layer is reduced, which is formed on the surface of a polysilicon layer due to the increase of a doping concentration in a polysilicon layer. As a result, the dopant loss, which is caused by the removing and cleansing of an ion implantation barrier used during doping, is reduced.

30 Claims, 9 Drawing Sheets

METHOD FOR DOPING POLYSILICON AND METHOD FOR FABRICATING A DUAL POLY GATE USING THE SAME

CROSS-REFERENCE TO RELATED APPLICATIONS

The present invention claims priority of Korean patent application numbers 2007-0087658 and 2008-0036657, filed on Aug. 30, 2007, and Apr. 21, 2008, respectively, which are incorporated by reference in their entirety.

BACKGROUND OF THE INVENTION

The present invention relates to a semiconductor fabricating technique, and more particularly, to a method for doping polysilicon and a method for fabricating a dual poly gate using the same.

It is well known that dual poly gates operate in a peripheral circuit of a dynamic random access memory (DRAM). Each dual poly gate includes an N-type polysilicon as a gate of an NMOS transistor and a P-type polysilicon as a gate of a PMOS transistor. If a gate of a PMOS transistor is formed of a P-type polysilicon unlike a typical structure where all the gates of NMOS and PMOS transistors are formed of an N-type polysilicon, a short channel effect is reduced, and also a drain saturation current Idsat, a sub threshold voltage, and a drain induced barrier lowering (DIBL) are improved with respect to the same threshold voltage Vt. Furthermore, a DRAM device can be fabricated with improved data retention time, low power consumption and high performance.

When applying a dual poly gate, if a cell region is formed of a recess gate, an N-type impurity needs to be uniformly doped into a gate polysilicon of an NMOS transistor at the cell region. When forming gates of NMOS and PMOS transistors constituting a device, a counter doping process is performed. After forming an N-type polysilicon, the counter doping process converts the N-type polysilicon into a P-type polysilicon by doping a P-type impurity into only the N-type polysilicon of a gate of the PMOS transistor.

While applying this counter doping process, a doping concentration of an impurity should be at least approximately $4.0 \times 10^{20}$ atms/cm$^3$. However, if high-doping of a high concentration is applied using a typical beam-line implant, there may be limitations in mass production. Accordingly, plasma doping is used for impurity doping such that a P-type polysilicon is formed.

However, when the plasma doping utilizes plasma enhanced chemical vapor deposition (PECVD), a by-product deposition layer is formed over polysilicon during the doping of an impurity and a profile is formed where most of the dopant is doped on the surface of the polysilicon. Accordingly, the dopant loss of approximately 70% to approximately 80% occurs due to the removing and cleaning processes of an ion implantation barrier for the impurity doping. Because most of the dopant is doped on the surface of the polysilicon, even after a subsequent thermal annealing, inter-diffusion in a polysilicon layer is less than expected when considering the beam line implant. Therefore, an impurity concentration on the interface between the polysilicon and a gate oxide layer is low and, according thereto, electrical characteristics of a device become deteriorated.

Figure 1:
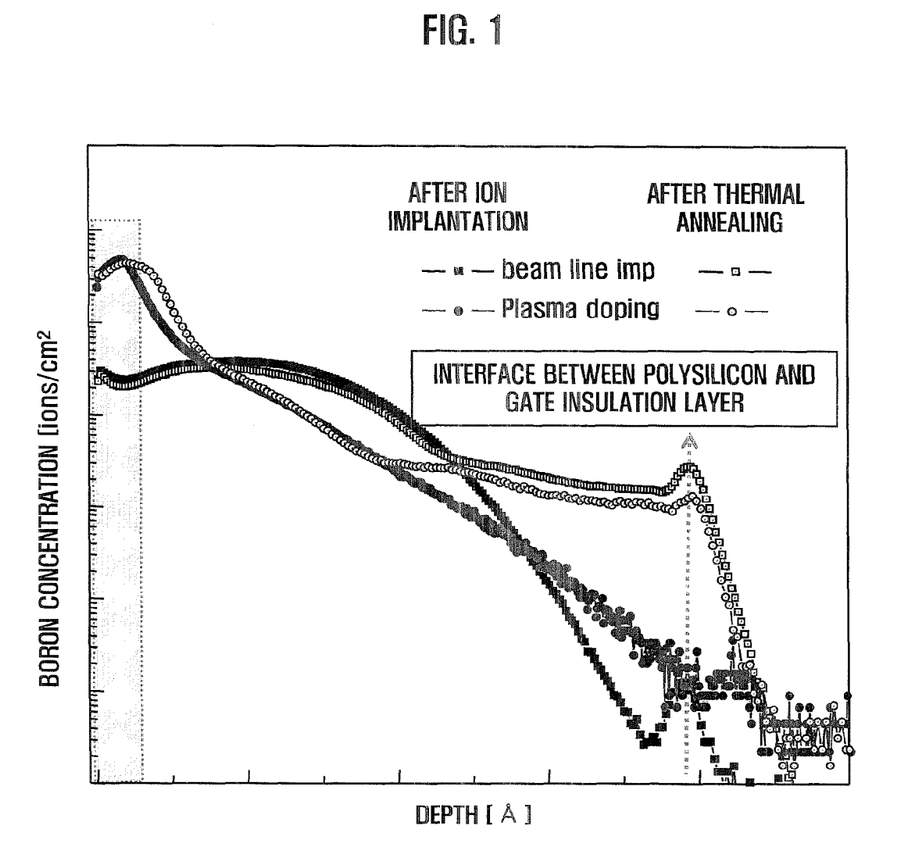
FIG. 1 illustrates a graph for comparing beamline implant with plasma doping.

FIG. 1 illustrates a graph for comparing beamline implant with plasma doping.

Referring to FIG. 1, after performing impurity doping through the beamline implant and the plasma doping a boron concentration by the plasma doping is more highly concentrated near the surface compared to the beamline implant.

Furthermore, in a case of the beamline implant, the boron concentration is uniform only up to a predetermined depth, but in a case of the plasma doping, the boron concentration is concentrated near the surface and its concentration is decreased drastically as it approaches the bottom. The dopant concentrated near the surface is removed by a subsequent cleansing process, and therefore, inter-diffusion becomes less when a subsequent impurity is activated. Accordingly, electrical characteristics of a device become deteriorated.

Figure 2:
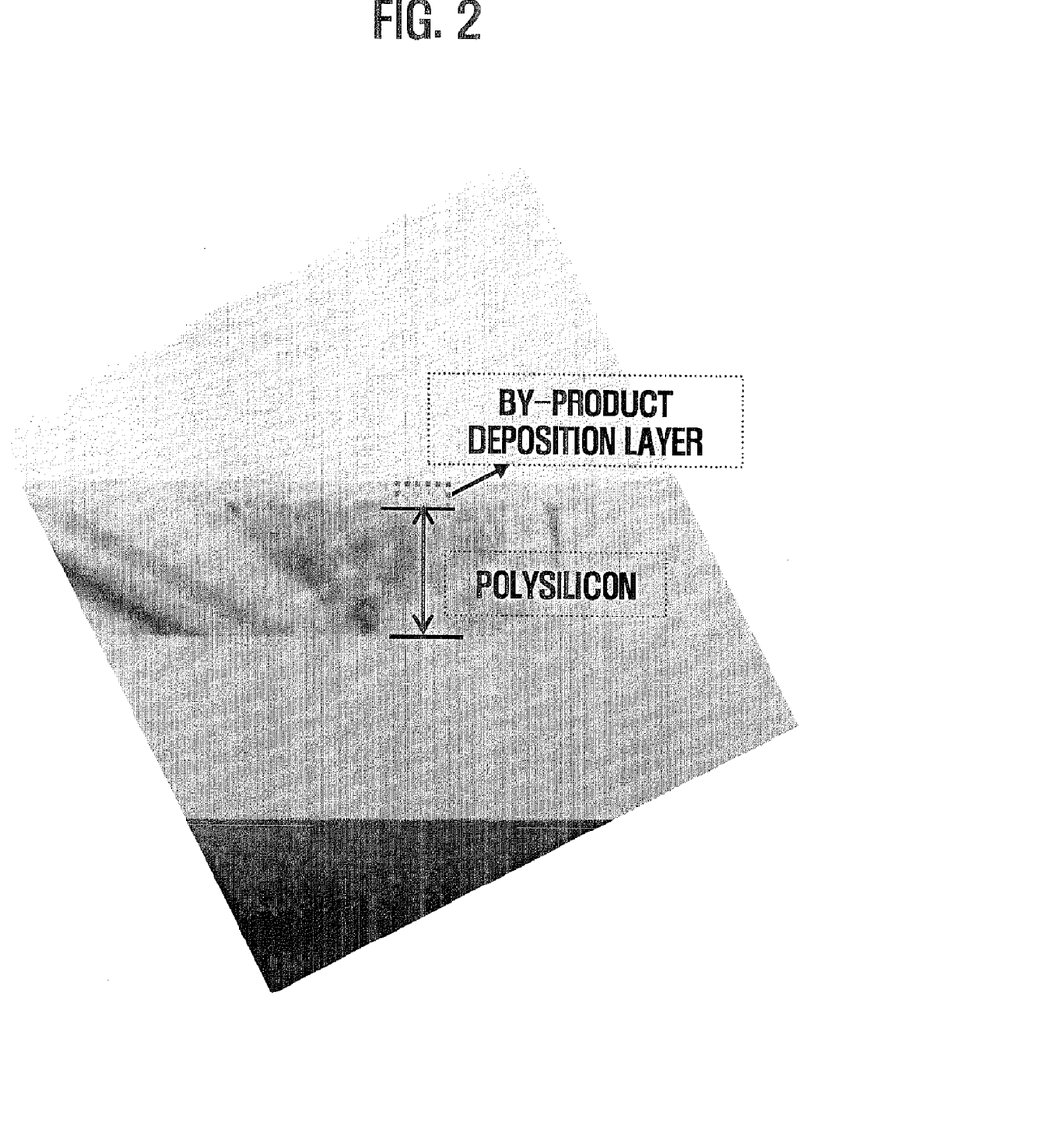
FIG. 2 illustrates a transmission electron microscope (TEM) picture after plasma doping.

FIG. 2 illustrates a transmission electron microscope (TEM) picture after plasma doping.

Referring to FIG. 2, a by-product deposition layer is formed over polysilicon. Due to the characteristics of plasma doping, the by-product deposition layer is formed on the surface of the polysilicon, and most of the dopant that is doped during the plasma doping is included in the by-product deposition layer. The by-product deposition layer is removed by a subsequent cleansing process and according thereto, dopant loss of approximately 70% to approximately 80% occurs.

SUMMARY OF THE INVENTION

Embodiments of the present invention are directed to providing a method for doping polysilicon to prevent dopant loss during plasma doping and a method for fabricating a dual poly gate using the same.

Embodiments of the present invention are also directed to providing a method for doping polysilicon to increase the uniformity of a doping concentration according to the depth of a layer inside and a method for fabricating a dual poly gate using the same.

In accordance with a first aspect of the present invention, there is provided a method for doping polysilicon. The method includes forming a first silicon layer over a substrate, crystallizing the first silicon layer, forming a second silicon layer over the first silicon layer, doping an impurity into the first and second silicon layers, and activating the impurity doped in the first and second silicon layers.

In accordance with a second aspect of the present invention, there is provided a method of fabricating a dual poly gate. The method includes forming a gate insulation layer over a substrate, the substrate having an NMOS region and a PMOS region, forming a first silicon layer over the gate insulation layer, crystallizing the first silicon layer, forming a second silicon layer over the first silicon layer, doping an impurity into the first and second silicon layers of the PMOS region, activating the impurity doped in the first and second silicon layers, and etching the first and second silicon layers to form a gate pattern.

DESCRIPTION OF SPECIFIC EMBODIMENTS

Hereinafter, a method for doping polysilicon and a method for fabricating a dual poly gate using the same in accordance with the present invention will be described in detail with reference to the accompanying drawings.

It will be understood that when an element such as a layer, a film, a pattern and a region is referred to as being 'on/under' another element herein, it may be directly on/under the other element, and one or more intervening elements may also be present.

According to the present invention, a method for improving a doping profile during plasma doping includes forming a silicon layer using two separate operations. After forming a first silicon layer, thermal annealing is performed to crystallize the first silicon layer, such that the uniformity of a doping concentration according to the depth of a layer inside is improved during plasma doping. Additionally, a doping concentration at the interface between a polysilicon layer and a gate oxide layer is increased. A by-product deposition layer is reduced, which is formed on the surface of a polysilicon layer due to the increase of a doping concentration in a polysilicon layer. As a result, the dopant loss, which is caused by the removing and cleansing of an ion implantation barrier used during doping, is reduced.

FIGS. 3A to 3D illustrate a method for doping polysilicon in accordance with an embodiment of the present invention.

Figure 3A:
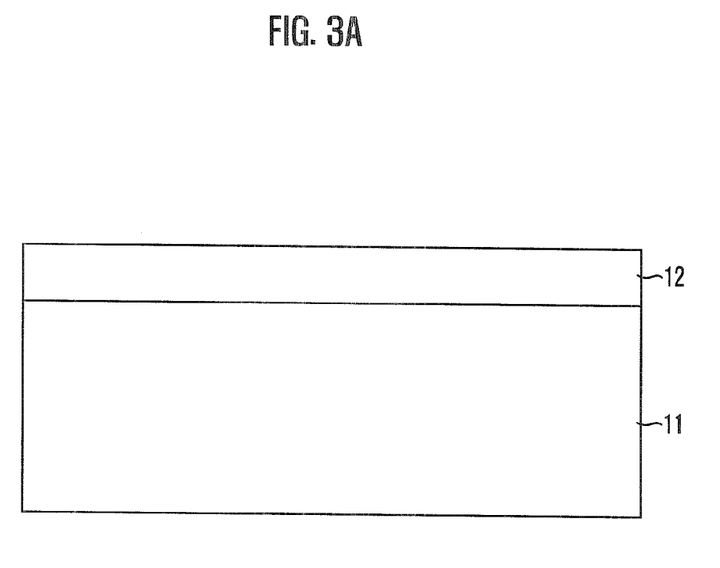
FIGS. 3A to 3D illustrate a method for doping polysilicon in accordance with an embodiment of the present invention.

Referring to FIG. 3A, a first silicon layer 12 is formed over a substrate 11. The first silicon layer 12 may include an amorphous material or a combination of an amorphous material and a crystalline material. The thickness of the first silicon layer 12 is approximately 20% to approximately 50% of the thickness of a second silicon layer. The reason for this is that influence for doping distribution of an impurity in a layer may be small if the first silicon layer 12 is too thin, but a poly depletion phenomenon (where an impurity penetrates into the substrate 11) may occur if the first silicon layer 12 is too thick. For example, the first silicon layer 12 may be formed with a thickness of approximately 100 Å to approximately 500 Å.

Figure 3B:
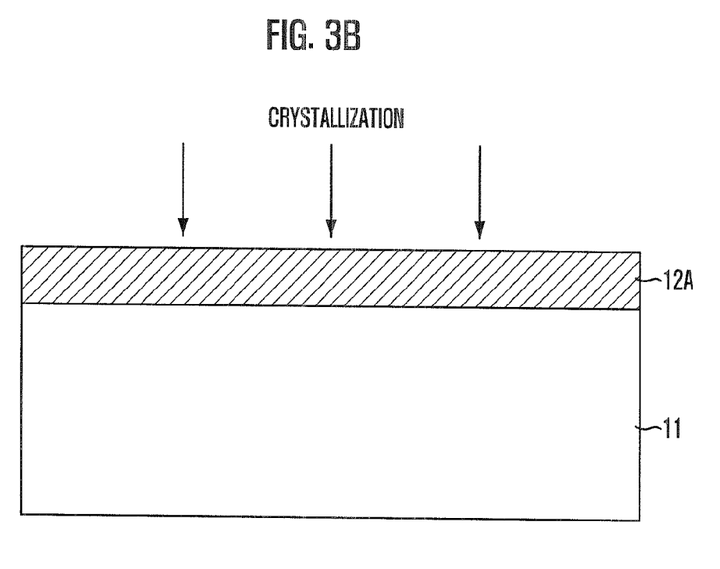

Referring to FIG. 3B, a first silicon layer 12A is crystallized. Thermal annealing may be performed to crystallize the first silicon layer 12A. Because the first silicon layer 12A includes an amorphous material or a combination of an amorphous material and a crystalline material, the number of grain boundaries may be increased by crystallizing the first silicon layer 12A through the thermal annealing. Once the first silicon layer 12A is crystallized, the number of nodes (where dopant is distributed during a subsequent impurity doping) is increased such that doping distribution smoothly occurs in a layer. That is, the uniformity of a doping concentration according to the depth of a layer inside is improved.

The thermal annealing for crystallizing the first silicon layer 12A includes conventional rapid thermal annealing. The conventional rapid thermal annealing is performed with a ramp up speed of approximately 20° C./sec to approximately 100° C./sec at a temperature of approximately 850° C. to approximately 1050° C.

Figure 3C:
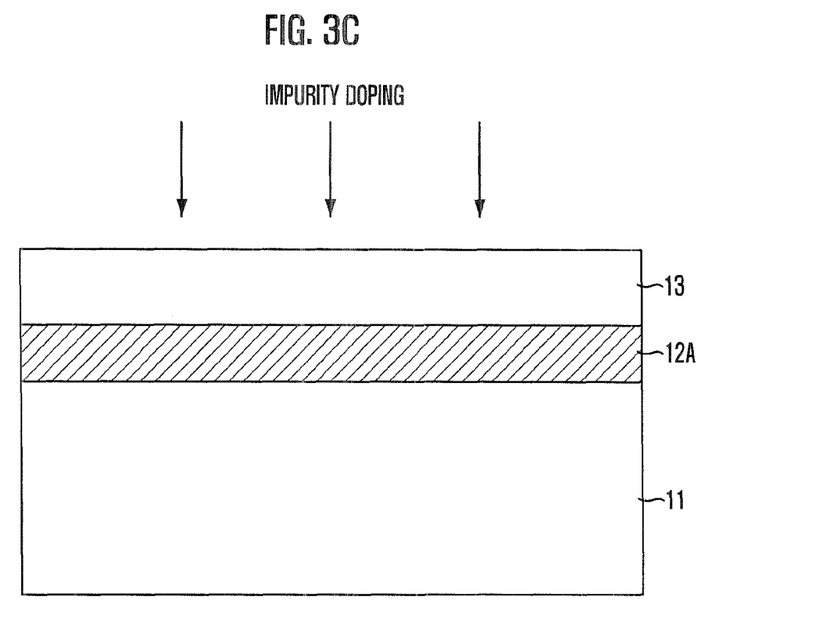

Referring to FIG. 3C, a second silicon layer 13 is formed over the first silicon layer 12A. The second silicon layer 13 may include an amorphous material, a crystalline material, and a combination thereof. The second silicon layer 13 is formed with a thickness of approximately 500 Å to approximately 1000 Å.

An impurity is doped into the first and second silicon layers 12A and 13. The doping of the impurity may be accomplished through plasma doping.

The first silicon layer 12A may include a greater amount of the dopant compared to when not being crystallized because the number of nodes (where dopants are distributed) is increased by crystallizing the first silicon layer 12A in FIG. 3B. That is, the dopants are not concentrated only near the surface of the second silicon layer 13, and are distributed into the first silicon layer 12A. Accordingly, the uniformity of a doping concentration according to the depth of a layer inside is improved. Moreover, a doping concentration between the first silicon layer 12A and the substrate 11 is increased. This will be described in more detail with reference to FIG. 5.

The fact that a greater amount of dopant is distributed in the first silicon layer 12A means that an amount of the impurity is increased in the layer inside and also means that the thickness of a by-product layer (which is formed on the surface of the second silicon layer 13) is reduced. That is, even when the same amount of impurity is doped, an amount of impurity doped in a layer is increased. Therefore, an impurity remaining on the surface is relatively reduced such that the thickness of a by-product layer is decreased.

Accordingly, the dopant loss due to a subsequent cleansing process is reduced. That is, because the amount of the impurity doped in the first and second silicon layers 12A and 13 is increased due to the crystallizing of the first silicon layer 12A, the dopant loss is decreased even when the by-product deposition layer is removed by a cleansing process.

Figure 3D:
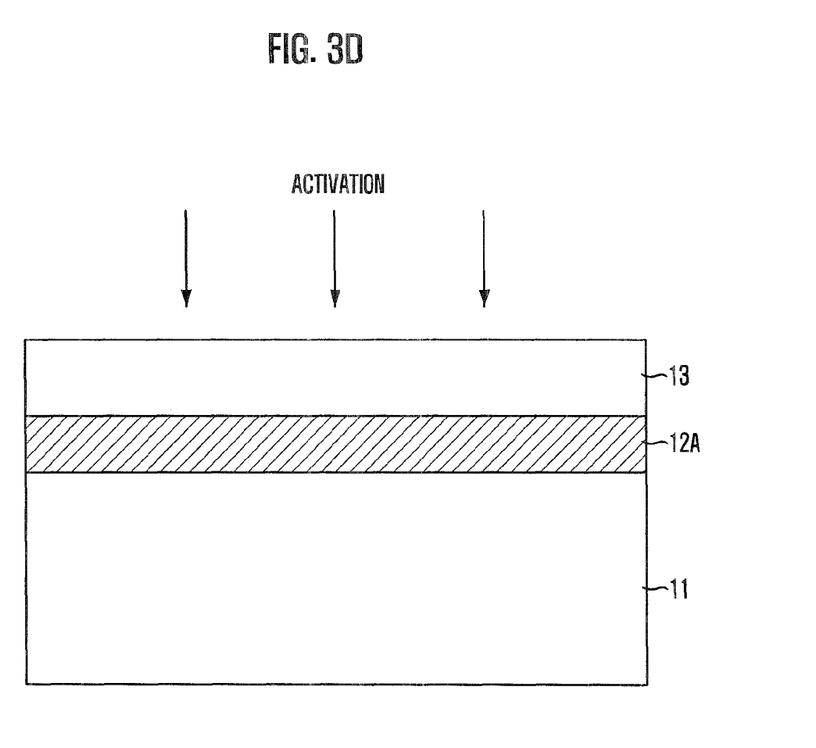

Referring to FIG. 3D, the impurity doped in the first and second silicon layers 12A and 13 is activated. Thermal annealing is performed to activate the impurity.

The thermal annealing is accomplished through rapid thermal annealing. The rapid thermal annealing may include spike rapid thermal annealing, conventional rapid thermal annealing, flash annealing, or laser annealing. Spike rapid thermal annealing is performed with a ramp up speed of approximately 100° C./sec to approximately 300° C./sec at a temperature of approximately 850° C. to approximately 1050° C.

The doping concentration according to the depth in a layer inside is increased because the impurity doped in the first and second silicon layers 12A and 13 is activated through the thermal annealing. Therefore, a doping concentration at the interface between the first silicon layer 12A and the substrate 11 is also increased.

FIGS. 4A to 4G illustrate a method for fabricating a dual poly gate in accordance with an embodiment of the present invention.

A semiconductor device includes a cell region and a peripheral (circuit) region. NMOS transistors are formed over the cell region. NMOS and PMOS transistors are formed over the peripheral region. For convenience of explanation, a region where the NMOS transistors are formed in the peripheral region is designated as an NMOS region and a region where the PMOS transistors are formed is designated as a PMOS region.

Figure 4A:
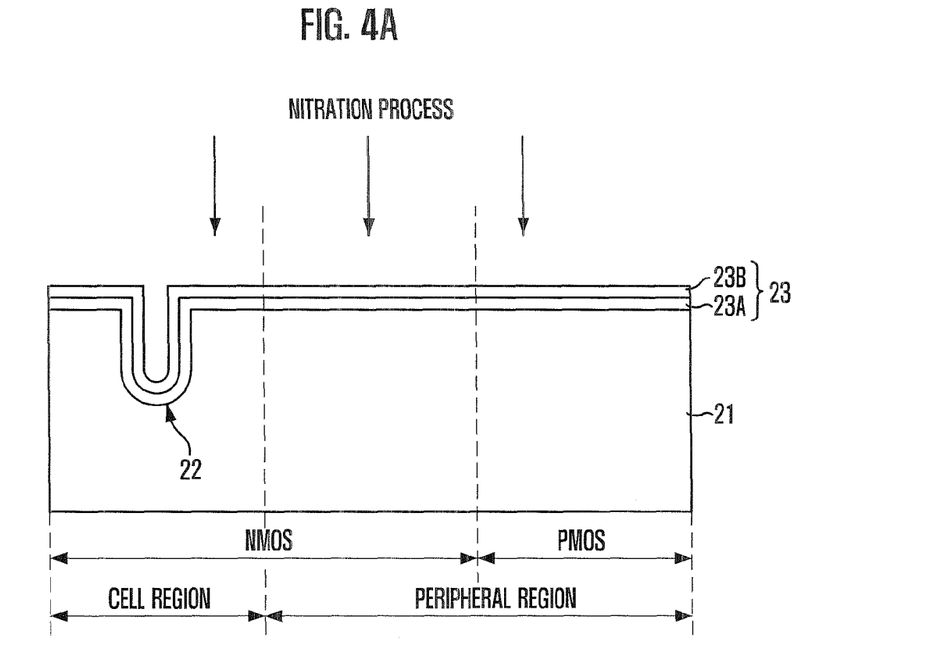
FIGS. 4A to 4G illustrate a method for fabricating a dual poly gate in accordance with an embodiment of the present invention.

Referring to FIG. 4A, a recess pattern 22 is formed in the cell region of a substrate 21. The recess pattern 22 is formed by forming a mask pattern over the substrate 21 and then partially etching the thickness of the substrate 21 through the mask pattern. The U-shaped recess pattern 22 is illustrated in this embodiment of the present invention, but the recess pattern 22 may include a polygonal form such as a bulb. A gate channel length is increased by forming the recess pattern 22 such that refresh characteristics can be improved.

An oxide layer 23A is formed over the substrate 21 including the recess pattern 22. The oxide layer 23A for a gate insulation layer is formed of a thermal oxide layer or a plasma oxide layer.

A nitration process is performed over the oxide layer 23A to partially change the oxide layer 23A into an oxide nitride layer 23B. The oxide nitride layer 23B serves as a gate insulation layer together with the oxide layer 23A. After a P-type impurity ion implantation is performed to form a subsequent dual poly gate, a furnace, plasma nitration, or rapid thermal processing is performed to prevent boron from penetrating into the substrate 21 during an activation process.

Especially, the plasma nitration process uses a plasma gas such as nitrogen ($N_2$) and argon (Ar) at a temperature of approximately 100° C. to approximately 700° C. Additionally, rapid thermal annealing is performed at a temperature of approximately 600° C. to approximately 1000° C. using an ammonia ($NH_3$) gas.

Like the above, the oxide layer 23A and the oxide nitride layer 23B formed through a nitration process are used as a gate insulation layer to prevent boron penetration in a subsequent polysilicon gate.

Hereinafter, the oxide layer 23A and the oxide nitride layer 23B are referred to as a gate insulation layer 23.

Figure 4B:
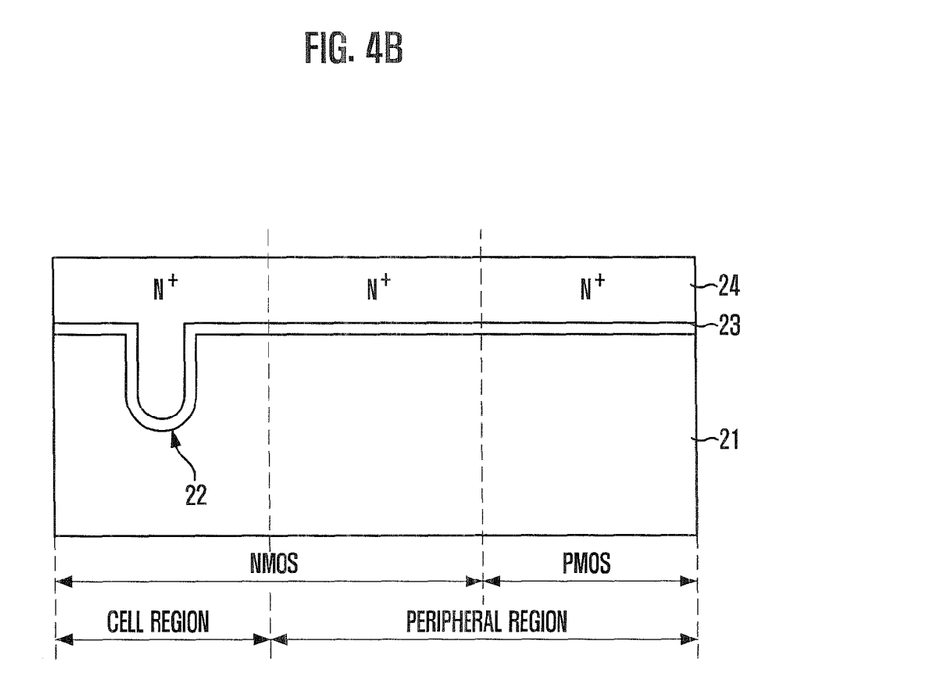

Referring to FIG. 4B, a first silicon layer 24 is formed over the gate insulation layer 23. The first silicon layer 24 may include an amorphous material or a combination of an amorphous material and a crystalline material. The thickness of the first silicon layer 24 is approximately 20% to approximately 50% of the thickness of a subsequent second silicon layer. The reason for this is that influence for doping distribution of an impurity in a layer may be small if the first silicon layer 24 is too thin, but a poly depletion phenomenon (where impurity penetrates into the substrate 21) may occur if the first silicon layer 24 is too thick. For example, the first silicon layer 24 may be formed with a thickness of approximately 100 Å to approximately 500 Å.

Especially, the first silicon layer 24 may be a silicon layer into which an N-type impurity is doped in-situ. The reason for this is that if the impurity is doped after forming the silicon layer, it is difficult to uniformly dope the impurity into the silicon layer filled in the recess pattern 22 due to the depth of the recess pattern 22 in the cell region.

Figure 4C:
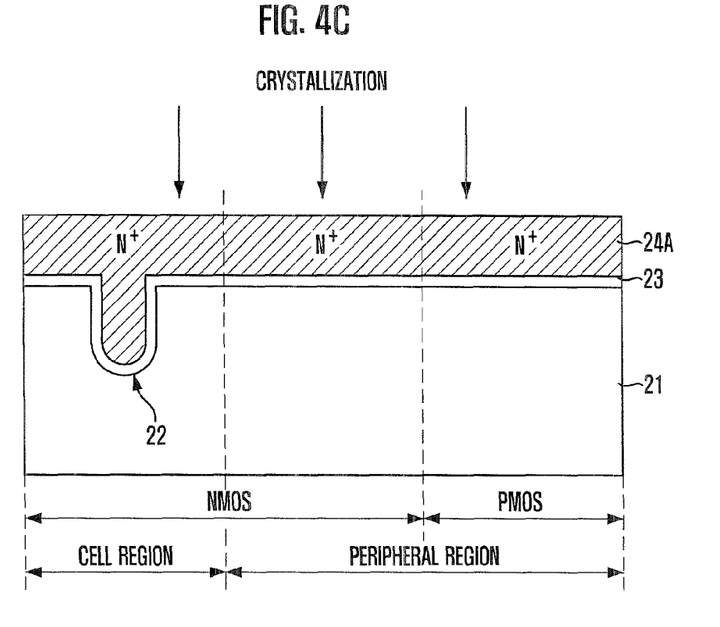

Referring to FIG. 4C, the first silicon layer 24A is crystallized. Thermal annealing can be performed to crystallize the first silicon layer 24A. Because the first silicon layer 24A includes an amorphous material or a combination of an amorphous material and a crystalline material, the number of grain boundaries can be increased by crystallizing the first silicon layer 24A through thermal annealing. Once the first silicon layer 24A is crystallized, the number of nodes (where dopant is distributed during subsequent impurity doping) is increased such that doping distribution smoothly occurs in a layer. That is, the uniformity of a doping concentration according to the depth of a layer inside is improved.

The thermal annealing for crystallizing the first silicon layer 24A includes conventional rapid thermal annealing. The conventional rapid thermal annealing is performed with a ramp up speed of approximately 20° C./sec to approximately 100° C./sec at a temperature of approximately 850° C. to approximately 1050° C.

Figure 4D:
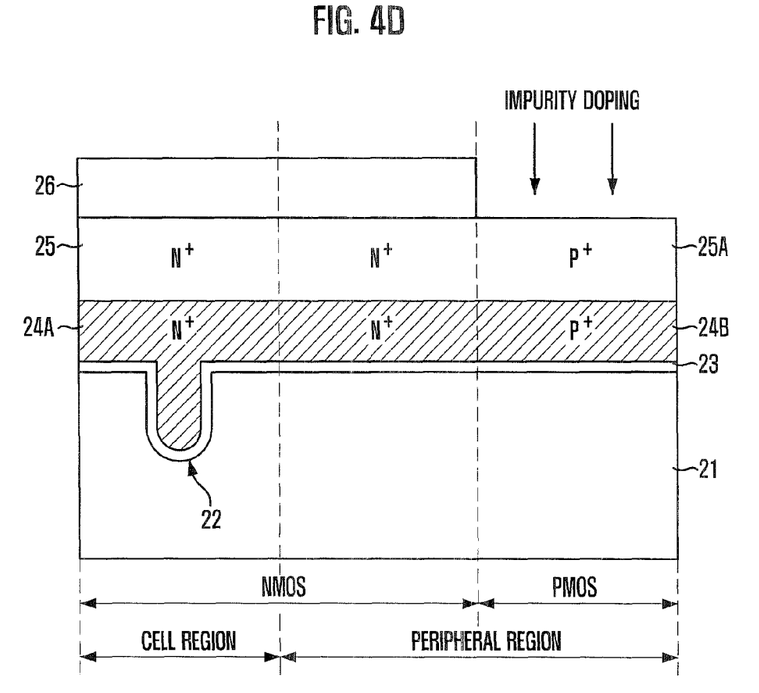

Referring to FIG. 4D, a second silicon layer 25 is formed over the first silicon layer 24A. The second silicon layer 25 may include an amorphous material, a crystalline material, or a combination thereof. The second silicon layer 25 is formed with a thickness of approximately 500 Å to approximately 1000 Å. Additionally, the second silicon layer 25 may be a silicon layer into which an N-type impurity is doped in-situ.

A photosensitive film pattern 26 is formed over the second silicon layer 25 to open a PMOS region of a peripheral region. To form the photosensitive film pattern 26, a photosensitive layer is coated on the second silicon layer 25, and then patterned to open the PMOS region of the peripheral region through exposure and development.

A P-type impurity is doped into the first and second silicon layers 24A and 25 by using the photosensitive film pattern 26 as an ion implantation barrier. Counter doping may be performed to convert conductive types of the first and second silicon layers 24A and 25. The counter doping may be accomplished through plasma doping such that mass production can be achieved. In order to convert the conductive types of the first and second silicon layers 24A and 25 doped with an N-type impurity, plasma doping may be performed using a P-type impurity. The P-type impurity includes boron. A source gas for boron may be boron trifluoride ($BF_3$), diborane ($B_2H_6$), or a combination thereof.

During plasma doping, the first silicon layer 24A is crystallized in FIG. 4B such that the number of nodes where dopants can be distributed is increased. Therefore, a greater amount of dopants can be included in the first silicon layer 24A compared to when the first silicon layer 24A is not crystallized. That is, the dopants are not concentrated near the surface of the second silicon layer 25 and are distributed into the first silicon layer 24A, such that the uniformity of a doping concentration according to the depth of a layer inside can be increased. Additionally, a doping concentration between the first silicon layer 24A and the gate insulation layer 23 is increased. This will be described in more detail with reference to FIG. 5.

The fact that a greater amount of dopants are distributed in the first silicon layer 24A means that an amount of impurity is increased in the layer, and also means that the thickness of a by-product deposition layer on the surface of the second silicon layer 25 is reduced. That is, even if the same amount of impurity is doped, because the amount of the impurity doped into the layer is increased, the impurity remaining on the surface is relatively reduced. Therefore, the thickness of the by-product deposition layer is reduced.

Accordingly, the dopant loss due to a subsequent cleansing process is reduced. That is, because the amount of an impurity doped into the first and second silicon layers 24A and 25 is increased by crystallizing the first silicon layer 24A, the dopant loss can be reduced even if the by-product deposition layer is removed by a cleansing process.

Additionally, as the amount of impurity doped into the first silicon layer 24A is increased, boron concentration is increased at the interface between the first silicon layer 24A and the gate insulation layer 23. Therefore, the deterioration of electrical characteristics can be prevented.

Hereinafter, the first silicon layer 24A doped with a P-type impurity is referred to as a P-type first silicon layer 24B, and a second silicon layer 25 doped with a P-type impurity is referred as a P-type second silicon layer 25A.

Figure 4E:
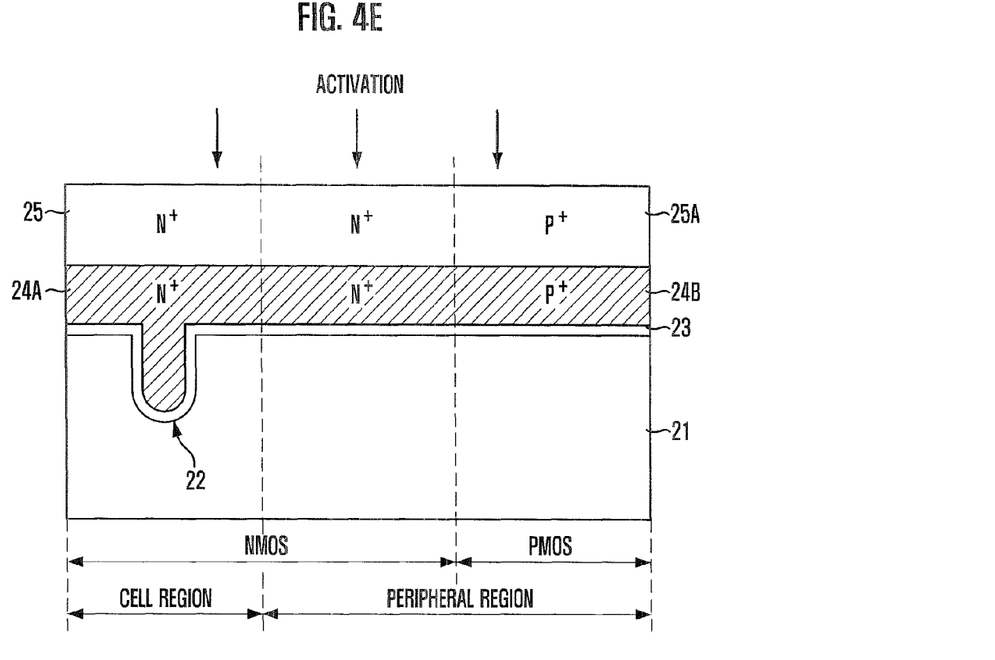

Referring to FIG. 4E, the photosensitive film pattern 26 is removed. The photosensitive film pattern 26 can be removed through dry etching, and the dry etching can be accomplished through an oxygen strip process. After removing the photosensitive film pattern 26, a cleansing process is performed.

The by-product deposition layer on the surface of the P-type second silicon layer 25A may be damaged by the removing and cleansing of the photosensitive film pattern 26. However, by increasing the doping concentration of the impurity in the layer and reducing the by-product deposition layer as illustrated in FIGS. 4B to 4D, the dopant loss caused by the damage of the by-product deposition layer can be minimized.

The impurity is activated, which is doped in the P-type first and second silicon layers 24B and 25A. Thermal annealing may be performed for activating the impurity.

The thermal annealing is accomplished through rapid thermal annealing. The rapid thermal annealing may include spike rapid thermal annealing, conventional rapid thermal annealing, flash annealing, or laser annealing. Spike rapid thermal annealing is performed with a ramp up speed of approximately 100° C./sec to approximately 300° C./sec at a temperature of approximately 950° C. to approximately 1200° C. Conventional rapid thermal annealing is performed with a ramp up speed of approximately 20° C./sec to approximately 100° C./sec at a temperature of approximately 850° C. to approximately 1050° C.

Through the thermal annealing, the impurity doped in the P-type first and second silicon layers 24B and 25A is activated, such that the doping concentration according to the depth of a layer inside can be more increased. Accordingly, the doping concentration is also increased at the interface between the silicon layer and the substrate.

Figure 4F:
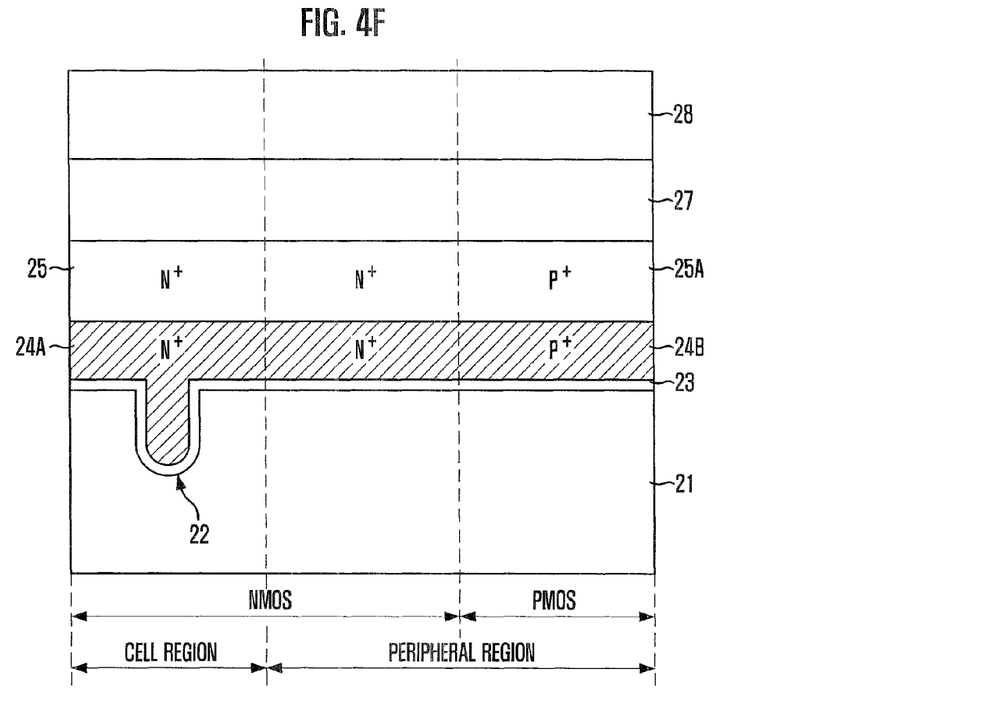

Referring to FIG. 4F, a metal conductive layer 27 and a hard mask layer 28 are stacked on the second silicon layer 25 and P-type silicon layer 25A. The metal conductive layer 27 may include a stacked structure of a tungsten (W) layer and a tungsten nitride (WN) layer, or a tungsten silicide layer. If the stacked structure includes a tungsten (W) layer and a tungsten nitride (WN) layer, the tungsten (W) layer has a thickness of approximately 300 Å to approximately 1800 Å, and the tungsten nitride layer has a thickness of approximately 20 Å to approximately 300 Å. If the stacked structure includes a tungsten silicide layer, the tungsten silicide layer has a thickness of approximately 700 Å to approximately 2500 Å.

The hard mask layer 28 protects an etching barrier used for etching a bottom layer during gate patterning and a gate electrode during self alignment contact for a subsequent landing plug contact. Additionally, the hard mask layer 28 may include a nitride (N) layer or a tungsten (W) layer for a hard mask over a nitride (N) layer. The nitride (N) layer has a thickness of approximately 1500 Å to approximately 4500 Å, and the tungsten (W) layer for a hard mask has a thickness of approximately 100 Å to approximately 1500 Å.

Figure 4G:
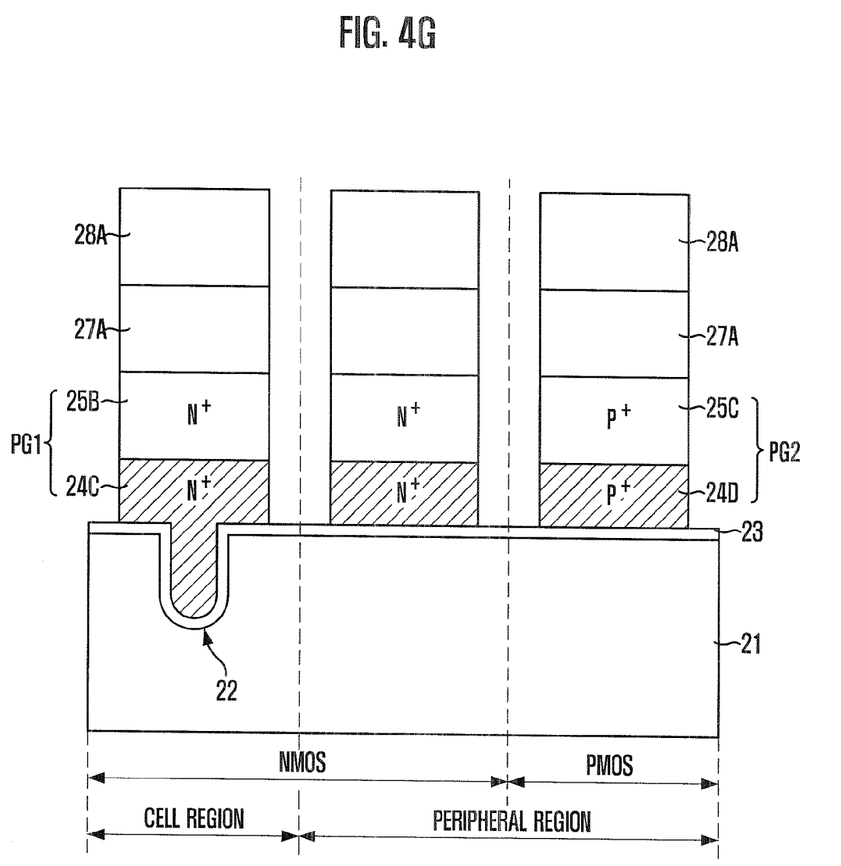

Referring to FIG. 4G, a gate pattern is formed through patterning. A photosensitive layer is coated on the hard mask layer 28 for patterning and is then etched to define a gate pattern region through exposure and development.

Accordingly, a gate pattern where an N-type polysilicon electrode PG1, a metal electrode 27A and the gate hard mask 28A are stacked is formed over the NMOS region. A gate pattern where a P-type polysilicon electrode PG2, a metal electrode 27A, and a gate hard mask 28A are stacked is formed over the PMOS region.

Figure 5:
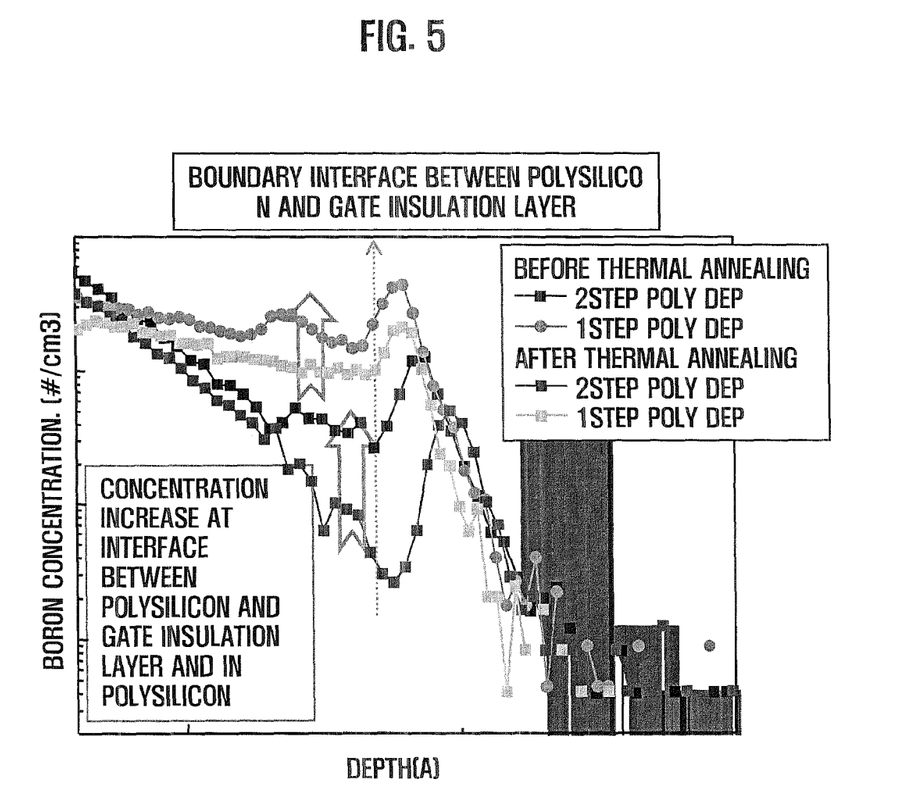
FIG. 5 illustrates the degree of impurity doping according to a method for fabricating polysilicon.

FIG. 5 illustrates the degree of impurity doping according to a method for fabricating polysilicon.

Referring to FIG. 5, in a case of a first polysilicon with crystal grains having sizes that are increased through first thermal annealing, boron concentration is drastically increased at the interface between the polysilicon and the gate insulation layer.

As mentioned above, after forming the first polysilicon layer with a thickness that is approximately 50% of the thickness of the expected polysilicon layer, the size of the crystal grain is drastically changed through the first thermal annealing. Additionally, after forming a second polysilicon layer, impurity doping is performed such that boron concentration is increased at the interface between the polysilicon layer and the gate insulation layer.

Additionally, due to the concentration increase of an impurity at the interface, the deterioration of electrical characteristics (which is caused by the dopant loss during plasma doping) can be prevented. Therefore, a short channel effect is reduced. Moreover, a drain saturation current Idsat, a sub threshold voltage, and drain induced barrier lowering (DIBL) are improved with respect to the same threshold voltage Vt. Furthermore, a DRAM device can be fabricated with improved data retention time, low power consumption and high performance by forming the dual poly gate, compared to the N+ polysilicon gate.

According to the present invention, the plasma doping method and the method for fabricating a dual poly gate using the same increase the number of nodes where dopants can be distributed by crystallizing an already formed silicon layer.

Accordingly, the uniformity of a doping concentration according to the depth of a layer inside is improved.

Moreover, the dopant loss is minimized by reducing a by-product deposition layer during plasma doping.

Furthermore, by increasing a doping concentration at the interface between a silicon layer and a substrate, the deteriorating of electrical characteristics can be prevented, which is caused by dopant loss during plasma doping.

As a result, a short channel effect is reduced. Additionally, a drain saturation current Idsat, a sub threshold voltage, and DIBL are improved with respect to the same threshold voltage Vt.

By forming a dual poly gate, a DRAM device can be fabricated with more improved data retention time, low power consumption and high performance, compared to an N-type polysilicon gate.

While the present invention has been described with respect to the specific embodiments, it will be apparent to those skilled in the art that various changes and modifications may be made without departing from the spirit and scope of the invention as defined in the following claims.

What is claimed is:

1. A method for doping polysilicon, the method comprising:
   forming a first silicon layer over a substrate;
   crystallizing the first silicon layer;
   forming a second silicon layer over the crystallized first silicon layer;
   plasma doping an impurity into the crystallized first silicon layer and the second silicon-layer;
   performing a cleaning process to remove a by-product deposition layer formed on the second silicon layer due to the plasma doping; and
   activating the impurity doped in the crystallized first silicon layer and the second silicon layer after the cleaning process.

2. The method of claim 1, wherein a thickness of the first silicon layer is 20% to 50% of a thickness of the second silicon layer.

3. The method of claim 2, wherein the first silicon layer has a thickness of 100 Å to 500 Å.

4. The method of claim 1, wherein the first silicon layer comprises an amorphous material or a combination of an amorphous material and a crystalline material.

5. The method of claim 1, wherein crystallizing the first silicon layer comprises thermal annealing.

6. The method of claim 5, wherein the thermal annealing comprises a conventional rapid thermal annealing.

7. The method of claim 6, wherein the thermal annealing is performed with a ramp up speed of 20° C./sec to 100° C./sec at a temperature of 850° C. to 1,050° C.

8. The method of claim 2, wherein the second silicon layer has a thickness of 500 Å to 1000 Å.

9. The method of claim 2, wherein the second silicon layer comprises one of an amorphous material, a crystalline material, and a combination thereof.

10. The method of claim 1, wherein activating the impurity comprises thermal annealing.

11. The method of claim 10, wherein the thermal annealing comprises one of spike rapid thermal annealing, conventional rapid thermal annealing, flash annealing, and laser annealing.

12. The method of claim 11, wherein the spike rapid thermal annealing is performed with a ramp up speed of 100° C./sec to 300° C./sec at a temperature of 950° C. to 1200° C.

13. The method of claim 11, wherein the conventional rapid thermal annealing is performed with a ramp up speed of 20° C./sec to 100° C./sec at a temperature of 850° C. to 1050° C.

14. A method of fabricating a dual poly gate, the method comprising:
    forming a gate insulation layer over a substrate, the substrate having an NMOS region and a PMOS region;
    forming a first silicon layer over the gate insulation layer;
    crystallizing the first silicon layer;
    forming a second silicon layer over the crystallized first silicon layer;
    plasma doping an impurity into the crystallized first silicon layer and the second silicon-layer in the PMOS region;
    performing a cleaning process to remove a by-product deposition layer formed over the second silicon layer due to the plasma doping;
    activating the impurity doped in the crystallized first silicon layer and the second silicon layer after the cleaning process; and
    etching the crystallized first silicon layer and the second silicon layer to form a gate pattern.

15. The method of claim 14, wherein a thickness of the first silicon layer is 20% to 50% of a thickness of the second silicon layer.

16. The method of claim 14, wherein the first silicon layer has a thickness of 100 Å to 500 Å.

17. The method of claim 14, wherein the first silicon layer comprises an amorphous material or a combination of an amorphous material and a crystalline material.

18. The method of claim 14, wherein crystallizing the first silicon layer comprises thermal annealing.

19. The method of claim 18, wherein the thermal annealing comprises conventional rapid thermal annealing.

20. The method of claim 19, wherein the thermal annealing is performed with a ramp up speed of 20° C./sec to 100° C./sec at a temperature of 850° C. to 1050° C.

21. The method of claim 14, wherein the second silicon layer has a thickness of 500 Å to 1,000 Å.

22. The method of claim 14, wherein the second silicon layer comprises one of an amorphous material, a crystalline material, and a combination thereof.

23. The method of claim 14, wherein the first and second silicon layers are doped with an N-type impurity.

24. The method of claim 14, wherein plasma doping the impurity comprises doping a P-type impurity.

25. The method of claim 14, wherein activating the impurity comprises thermal annealing.

26. The method of claim 25, wherein the thermal annealing comprises one of spike rapid thermal annealing, conventional rapid thermal annealing, flash annealing, and laser annealing.

27. The method of claim 26, wherein the spike rapid thermal annealing is performed with a ramp up speed of 100° C./sec to 300° C./sec at a temperature of 950° C. to 1,200° C.

28. The method of claim 26, wherein the conventional rapid thermal annealing is performed with a ramp up speed of 20° C./sec to 100° C./sec at a temperature of 850° C. to 1,050° C.

29. The method of claim 14, further comprising stacking a metal conductive layer and a hard mask layer on the crystallized first silicon layer and the second silicon layer after the activating of the impurity.

30. The method of claim 29, wherein the metal conductive layer comprises a stack layer of a tungsten nitride layer and a tungsten layer, or a tungsten silicide layer.

* * * * *